United States Patent
Pazhayaveetil et al.

(10) Patent No.: US 10,644,593 B2
(45) Date of Patent: May 5, 2020

(54) DC-DC CONVERTER

(71) Applicant: Cirrus Logic International Semiconductor Ltd., Edinburgh (GB)

(72) Inventors: Ullas Pazhayaveetil, Cedar Park, TX (US); Sarang Vadnerkar, Austin, TX (US); Theodore M. Burk, Austin, TX (US); Jeffrey May, Dripping Springs, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/227,819

(22) Filed: Dec. 20, 2018

(65) Prior Publication Data

US 2019/0123644 A1 Apr. 25, 2019

Related U.S. Application Data

(62) Division of application No. 15/984,965, filed on May 21, 2018, now Pat. No. 10,461,638.

(Continued)

(51) Int. Cl.
*H02M 3/156* (2006.01)
*H02M 1/00* (2006.01)
(Continued)

(52) U.S. Cl.
CPC ............. *H02M 3/156* (2013.01); *H02M 1/08* (2013.01); *H03F 1/025* (2013.01); *H03F 1/0227* (2013.01);
(Continued)

(58) Field of Classification Search
CPC .................. H02M 3/156; H02M 1/08; H02M 2001/0009; H02M 2001/0012;
(Continued)

(56) References Cited

U.S. PATENT DOCUMENTS 7,737,668 B2    6/2010  Oswald et al.
8,760,138 B2 *  6/2014  Nishida ................ H02M 3/156
                                                            323/222

(Continued)

FOREIGN PATENT DOCUMENTS

WO          2015119958 A1     8/2015

OTHER PUBLICATIONS

International Search Report and Written Opinion of the International Searching Authority, International Application No. PCT/GB2018/051363, dated Jul. 19, 2018.

(Continued)

*Primary Examiner* — Dinh T Le
(74) *Attorney, Agent, or Firm* — Jackson Walker L.L.P.

(57) ABSTRACT

A DC-DC converter and corresponding method for transitioning between a discontinuous conduction mode, DCM, and a continuous conduction mode, CCM, wherein the DC-DC converter is configured to power a signal processing system within an integrated circuit, is provided. The method comprises receiving input data, wherein the input data is for inputting into the signal processing system; determining an amplitude of the input data; and transitioning between DCM and CCM based on the amplitude of the input data. A DC-DC converter and respective method for transitioning from CCM to DCM comprising determining an estimated current representative of an inductor current through an inductor of the DC-DC converter; and transitioning from CCM to DCM based on the estimated current, is provided. A DC-DC converter and respective method for transitioning from DCM to CCM comprising determining either an output voltage of the DC-DC converter or a duty cycle of the DC-DC converter; and transitioning from DCM to CCM based on the determined output voltage or duty cycle of the DC-DC converter, is provided.

16 Claims, 14 Drawing Sheets

Related U.S. Application Data

(60) Provisional application No. 62/509,529, filed on May 22, 2017.

(51) Int. Cl.
  *H02M 1/08* (2006.01)
  *H03F 1/02* (2006.01)
  *H03F 3/181* (2006.01)

(52) U.S. Cl.
  CPC ..... *H03F 3/181* (2013.01); *H02M 2001/0009* (2013.01); *H02M 2001/0012* (2013.01); *H02M 2001/0032* (2013.01); *H02M 2001/0048* (2013.01)

(58) Field of Classification Search
  CPC .. H02M 2001/0032; H02M 2001/0048; H03F 1/0227; H03F 3/181
  USPC ......................................................... 327/541
  See application file for complete search history.

(56) References Cited

U.S. PATENT DOCUMENTS

| | | | |
|---|---|---|---|
| 8,766,615 B2* | 7/2014 | Nishida | H02M 3/156 323/222 |
| 8,975,879 B2 | 3/2015 | Xu et al. | |
| 10,135,330 B2 | 11/2018 | Zhang et al. | |
| 2010/0148379 A1 | 6/2010 | Noro et al. | |
| 2011/0148379 A1* | 6/2011 | Gu | H02M 3/156 323/284 |
| 2012/0223774 A1 | 9/2012 | Southcombe et al. | |
| 2015/0030183 A1 | 1/2015 | Pazhayaveetil et al. | |
| 2018/0234014 A1 | 8/2018 | Vadnerkar et al. | |

OTHER PUBLICATIONS

Erickson, Robert et al.: "Fundamentals of Power Electronics, Second Edition, Chapter 5", Dec. 31, 2004, pp. 107-125.

\* cited by examiner

DC-DC CONVERTER

This application is a divisional of U.S. patent application Ser. No. 15/984,965, filed May 21, 2018, which claims benefit to U.S. Provisional Application Ser. No. 62/509,529, filed May 22, 2017, each of which is incorporated by reference herein in its entirety.

TECHNICAL FIELD

Embodiments disclosed herein relate to methods and apparatus for transitioning a DC-DC converter between a discontinuous conduction mode (DCM) and a continuous conduction mode (CCM).

BACKGROUND

Portable devices are becoming more common in every aspect of our lives. For example, many consumers listen to their music from portable audio players. These portable devices become easier and more enjoyable to use when they are provided in small packages, offering the same capabilities while still having long lasting battery charge. To support these longer lasting devices, the operating voltage of many of the components inside is often reduced to reduce the power consumption. However, this reduction in operating voltage may affect the sound output of the portable device as the volume level of an audio signal is proportional to the output voltage. Boost converters may therefore be used to increase the operating voltage for select components within a portable device that would benefit from higher operating voltages, for example, audio amplifiers which may require high voltages to provide high volumes.

FIG. 1 illustrates a conventional audio amplifier comprising a boost converter. The audio amplifier comprises a battery supply 102 which is configured to provide a voltage $V_p$ to a boost converter 104. The boost converter 104 increases the voltage $V_p$ to a boost voltage $V_{BST}$. In this example, a speaker amplifier 108 is configured to receive the boost voltage $V_{BS}T$ and to output an analog audio signal, SIG, from a digital to analog converter (DAC) 106. The speaker amplifier increases the low power signal, SIG, with the power received from the boost converter to generate a signal to drive a speaker 110. The boost voltage $V_{BST}$ is higher than the supply voltage $V_p$ which allows the speaker amplifier 108 to provide louder audio signals through the speaker 110 than would be possible using only the supply voltage $V_p$.

However, generating the boost voltage $V_{BST}$ may have some drawbacks such as increased power consumption of the audio amplifier 100. In other words, as the speaker amplifier is receiving the boost voltage $V_{BST}$ then, even in circumstances where the volume levels are low, the speaker amplifier is wasting power compared to an implementation where it only receives $V_p$. This wasted power may shorten the operating time of the device comprising the audio amplifier between charges, and may be detrimental to the user experience of the device.

In portable devices, operational battery life for a given charge cycle may be considered critical. Consumers may request that end manufacturers produce longer times between battery charging cycles. This request then may encourage the end manufacturers to require original equipment managers (OEMs) and hardware developers to reduce operational power consumption in their sub-systems wherever possible, in order to extend battery life between charging cycles. Boosted amplifiers may often be one of the heavy power consumers in a portable device containing audio amplification. Managing the operational transitions between discontinuous conduction mode (DCM) and continuous conduction mode (CCM) is one method of managing power losses. CCM operation may be more efficient than DCM when delivering higher output power. However, if the load requirements on the boost are reduced, the average current through the boost converter may also be reduced. However, CCM operation may push and pull current through the inductor even when no power is consumed by the load. This operation may produce losses through the inductor, for example, switching losses, and cross conduction losses which may be unnecessary to maintain the boosted supply voltage ($V_{BST}$) during low loading conditions. Transitioning over to DCM operation may therefore allow the system to significantly reduce these losses while operating in a low or idle power loading conditions. Conversely, if the load on the $V_{BST}$ supply is larger, operating in DCM may be less efficient than operating in CCM mode, and therefore the boosted system may operate in CCM mode in order to increase battery operational life for a given boosted amplifier load.

SUMMARY

According to some embodiments there is provided a method in a DC-DC converter for transitioning between a discontinuous conduction mode, DCM, and a continuous conduction mode, CCM, wherein the DC-DC converter is configured to power a signal processing system within an integrated circuit. The method comprises receiving input data, wherein the input data is for inputting into the signal processing system; determining an amplitude of the input data; and transitioning between the DCM and the CCM based on the amplitude of the input data.

According to some embodiments, there is provided a method in a DC-DC converter for transitioning from a continuous conduction mode CCM to a discontinuous conduction mode, DCM. The method comprises determining an estimated current representative of an inductor current through an inductor of the DC-DC converter; and transitioning from CCM to DCM based on the estimated current.

According to some embodiments, there is provided a method in a DC-DC converter for transitioning from a discontinuous conduction mode, DCM, to a continuous conduction mode, CCM. The method comprises determining either an output voltage of the DC-DC converter or a duty cycle of the DC-DC converter; and transitioning from DCM to CCM based on the determined output voltage or duty cycle of the DC-DC converter.

According to some embodiments, there is provided a DC-DC converter configured to transition between a discontinuous conduction mode, DCM, and a continuous conduction mode, CCM, wherein the DC-DC converter is configured to power a signal processing system within an integrated circuit. The DC-DC converter comprises a controller comprising an input configured to receive input data for input into the signal processing system; a determination block configured to determine an amplitude of the input data; and a transitioning block configured to cause the DC-DC converter to transition between the DCM and the CCM based on the amplitude of the input data.

According to some embodiments, there is provided a DC-DC converter configured to transition from a continuous conduction mode, CCM, to a discontinuous conduction mode, DCM. The DC-DC converter comprises an inductor; and a controller comprising a current estimation block configured to determine an estimated current representative of an inductor current through the inductor; and a transitioning block configured to cause the DC-DC converter to transition from CCM to DCM based on the estimated current.

According to some embodiments, there is provided a DC-DC converter configured to transition from a discontinuous conduction mode, DCM, to a continuous conduction mode, CCM. The DC-DC converter comprises a controller comprising a determination block configured to determine either an output voltage of the DC-DC converter or a duty cycle of the DC-DC converter; and a transitioning block configured to cause the DC-DC converter to transition from DCM to CCM based on the determined output voltage or duty cycle of the DC-DC converter.

BRIEF DESCRIPTION OF THE DRAWINGS

For a better understanding of the embodiments of the present disclosure, and to show how it may be put into effect, reference will now be made, by way of example only, to the accompanying drawings, in which:—

DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 2:
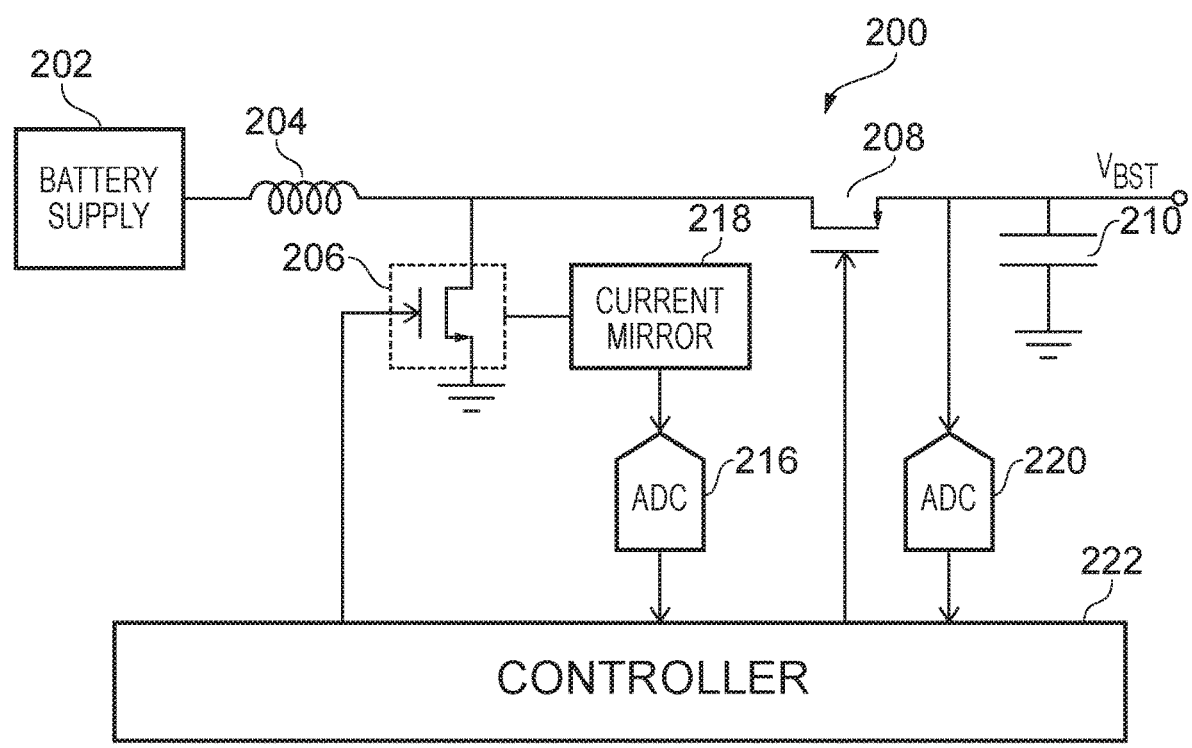
FIG. 2 is an example block diagram of a DC-DC converter in accordance with an embodiment of the present disclosure.

FIG. 2 illustrates an example DC-DC converter 200 in accordance with embodiments of the present disclosure. The DC-DC converter 200 comprises a battery supply 202 which provides a supply voltage $V_P$ to the DC-DC converter 200. The DC-DC converter 200 comprises an inductor 204 connected to the battery supply 202. The DC-DC converter 200 further comprises two switches 206 and 208 and a capacitor 210. The switches 206 and 208 are in this example implemented as an n-channel field effect transistor (NFET) 206 and a p-channel field effect transistor (PFET) 208.

In this example implementation, the inductor 204 is coupled to the drain terminal of the PFET 208 and the drain terminal of the NFET 206. The drain terminal of the PFET 208 and the drain terminal of the NFET 206 are also coupled together.

The capacitor 210 is coupled between the source terminal of the PFET 208 and ground. The source terminal of the NFET 206 is coupled to ground. Both the gate terminal of the PFET 208 and the gate terminal of the NFET 206 are coupled to a controller 222 which controls whether the PFET 208 and NFET 206 are in conducting or non-conducting states. An amplifier or other signal processing circuitry may be connected to receive the boost voltage from the source terminal of the PFET 208.

For example, during a first time period, the NFET 206 may be switched on to a conducting state which couples the inductor 204 to ground, while the PFET 208 is switched off to a non-conducting state. This switching configuration causes the supply voltage $V_P$ to fall across the inductor 204 and therefore causes current to flow through the inductor 204. The current flowing through the inductor 204 thereby stores energy in the inductor 204.

During a second time period, the NFET 206 may be switched off into a non-conducting state while the PFET 208 may be switched on to a conducting state. This switch configuration causes the inductor 204 to couple to ground through the capacitor 210. Thus, the energy stored in the inductor 204 during the first time period is transferred to the capacitor 210 during the second time period. As energy is stored in the capacitor 210, the voltage across the capacitor increases and allows the boost voltage $V_{BST}$ to increase beyond the supply voltage $V_P$.

A controller 222 may control the duration of the first and second time periods in order to regulate the transfer of power from the inductor 204 to the capacitor 210 and thus regulate the level of the boost voltage $V_{BST}$.

It will be appreciated that such a DC-DC converter 200 may operate in two distinct modes: continuous conduction mode, CCM, and discontinuous conduction mode, DCM.

Figure 3A:
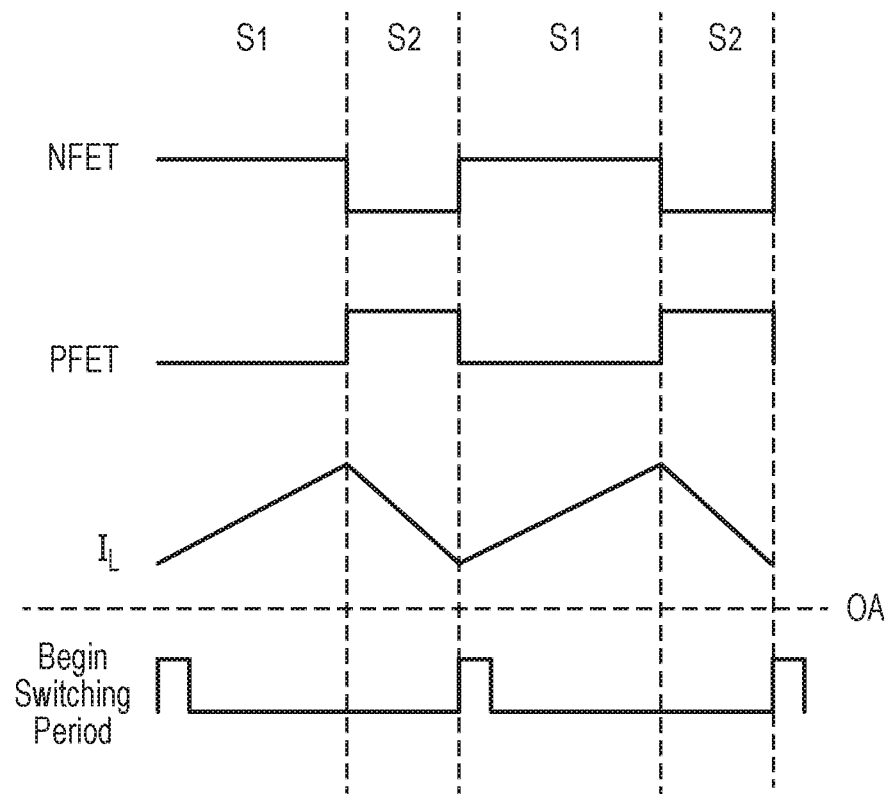
FIG. 3a is an example timing diagram illustrating the operation of a boost converter in a continuous conduction mode, CCM, in accordance with an embodiment of the present disclosure.

FIG. 3a illustrates the operation of a boost converter in a continuous conduction mode, CCM. In this state, the DC-DC converter 200 operates with two switching states $S_1$ and $S_2$ per switching cycle. The controller 222 may control the duty cycle of the switching states within each switching period. As previously described, during state $S_1$, NFET 206 is in a conducting state and PFET 208 is in a non-conducting state. During this period, the current is drawn across the inductor 204 storing energy in the inductor 204. In switching state $S_2$, as described previously, the PFET 208 is in a conducting state and the NFET 206 is in a non-conducting state. During this period, the energy stored in the inductor 204 is transferred to the capacitor 210 and the current through the inductor drops.

The controller may control the length of the duty cycle in order to maintain the output voltage, i.e. the boost voltage $V_{BST}$, within a predefined range. In other words, if $V_{BST}$ goes above a maximum voltage $V_{max}$, the time spent in state $S_1$ may be reduced and if $V_{BST}$ drops below a minimum voltage $V_{min}$, then the time spent in state $S_1$ may be increased.

The switching state may be switched from state $S_2$ to state $S_1$ at the beginning of each clock cycle as illustrated by the pulses indicating the start of each cycle of the switching frequency in FIG. 3a.

Figure 3B:
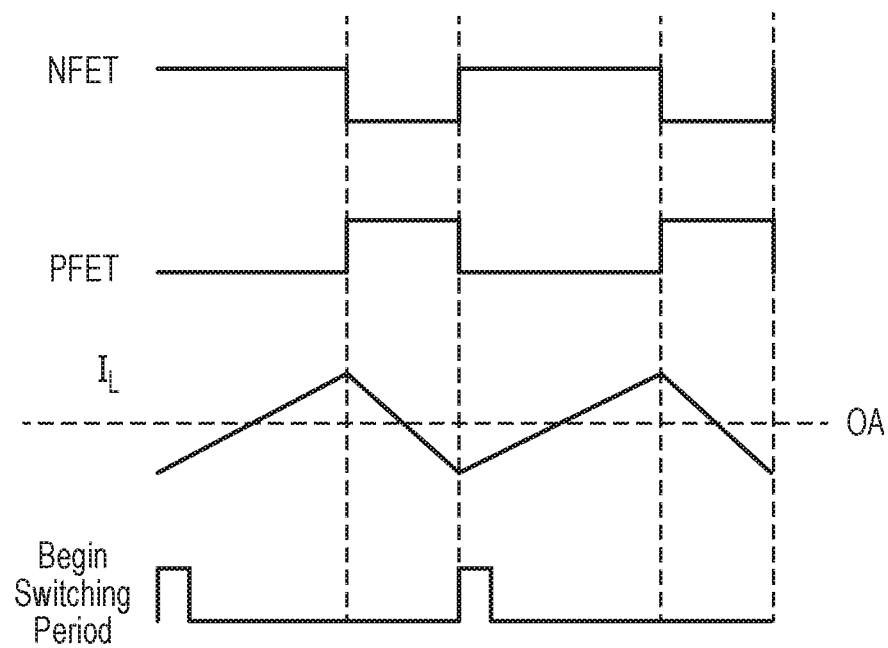
FIG. 3b is another example timing diagram illustrating the operation of a boost converter in a continuous conduction mode, CCM, in accordance with an embodiment of the present disclosure.

However, when the load current decreases, in other words a higher resistance is coupled to receive the boost voltage $V_{BST}$, the inductor current also decreases. In this case, if the boost converter is left to operate in continuous conduction mode, then the inductor current may become negative in each switching period, as illustrated in FIG. 3b. This negative current may waste power by passing negative current across the inductor.

The boost converter may therefore be operated in discontinuous conduction mode (DCM). In DCM, there may be, for example, three different switching states. The first and second switching states $S_1$ and $S_2$ may be the same as illustrated for CCM in FIGS. 3a and 3b, but in a third switching state $S_3$ both the NFET 206 and the PFET 208 may be in a non-conducting state.

Figure 4:
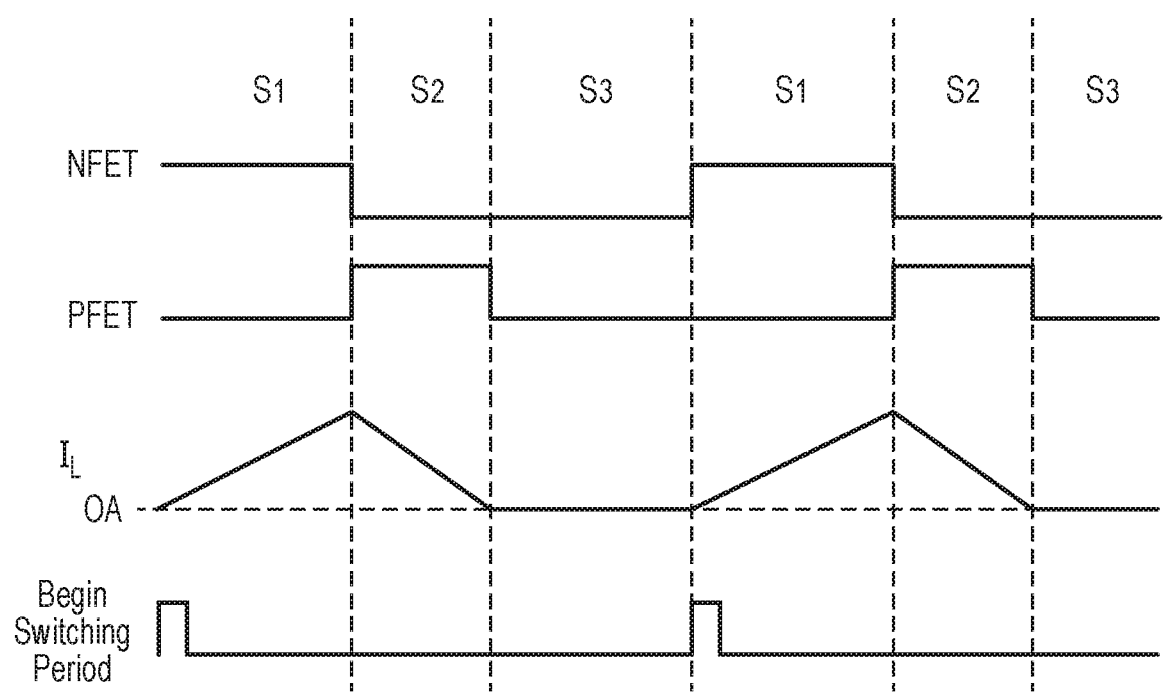
FIG. 4 is an example timing diagram illustrating the operation of a boost converter in discontinuous conduction mode, DCM, in accordance with an embodiment of the present disclosure.

As the PFET 208 is switched off, this switch deactivation stops any current flowing back through the inductor in a negative direction, thereby pinning or maintaining the inductor current at 0 A as illustrated in FIG. 4. This mode therefore avoids wasting power by not allowing negative current through the inductor.

It may therefore be desirable to provide a method of switching between the CCM mode illustrated in FIG. 3a and the DCM mode illustrated in FIG. 4 dependent on the load on the DC-DC converter 200.

Figure 1:
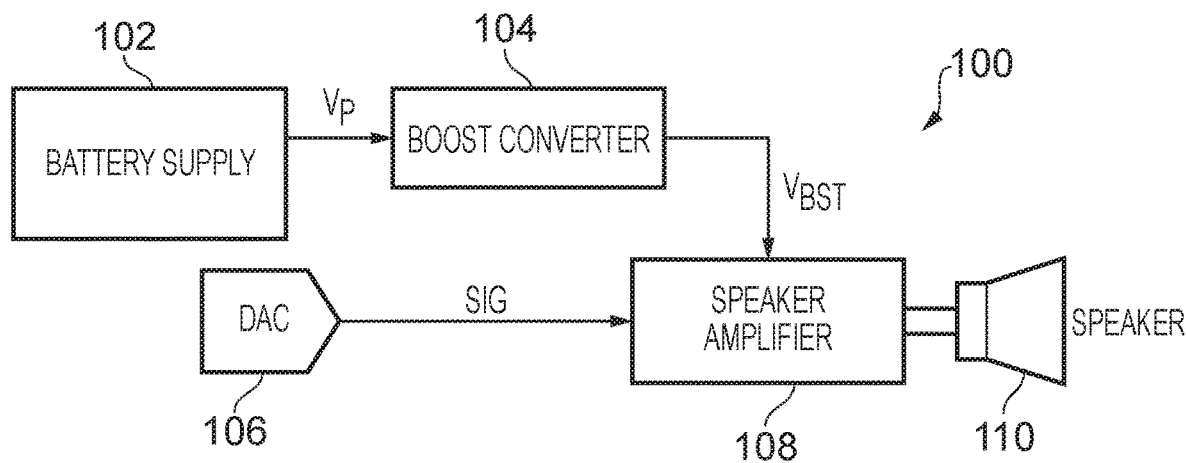
FIG. 1 is an example block diagram of a conventional audio amplifier comprising a boost converter in accordance with the prior art.

The controller 222 of FIG. 2 may therefore also receive one or more variables in order to control the operation of the DC-DC converter 200. In some examples, the controller 222 is configured to receive an indication of a signal SIG, which is for inputting into a signal processing system such as the speaker amplifier 108 in FIG. 1.

In some embodiments, the controller 222 is configured to receive an indication of the boost voltage $V_{BST}$. For example, the DC-DC converter 200 may comprise an analog to digital converter (ADC) 220 configured to receive the boost voltage $V_{BST}$ and output a digital version of the boost voltage to the controller 222.

In some embodiments, the controller 222 is configured to receive an indication of an estimated current representative of an inductor current through the inductor 204. For example, the DC-DC converter may comprise a current mirror 218 configured to mirror the current through the NFET 206, and thus the current through the inductor 204 during the switching state $S_1$. The mirrored current may then be input into an ADC 216 which outputs a digital version of the mirrored current to the controller 222.

The controller 222 may then control the length of the different switching periods based on the aforementioned variables.

Figure 5:
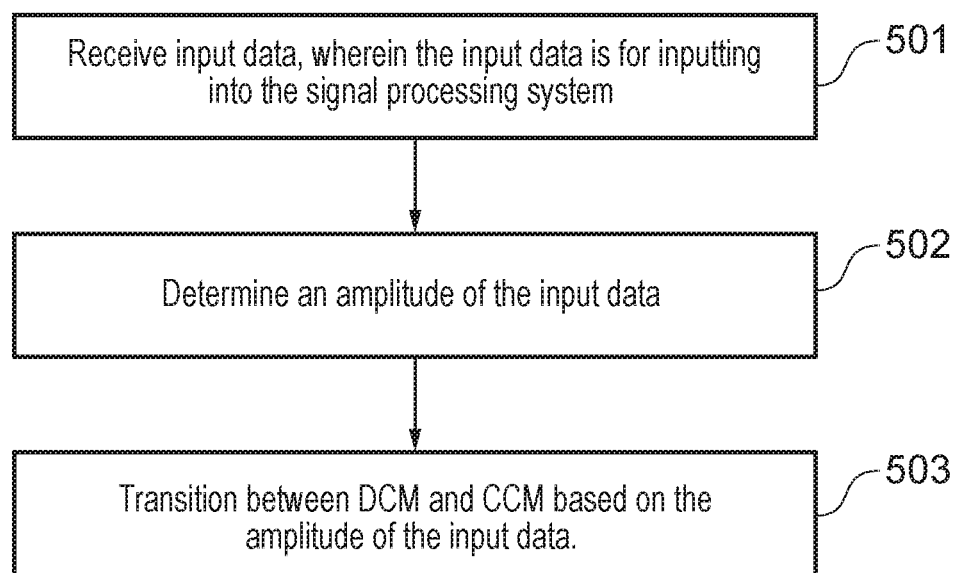
FIG. 5 is an example flow chart diagram illustrating a method in a DC-DC converter for transitioning between a discontinuous conduction mode, DCM, and a continuous conduction mode, CCM, in accordance with the present disclosure.

FIG. 5 is an example flow chart that illustrates a method in a DC-DC converter for transitioning between a discontinuous conduction mode, DCM, and a continuous conduction mode, CCM. In this embodiment, the DC-DC converter is configured to power a signal processing system, for example an amplifier. The signal processing system and DC-DC converter may be coupled together within an integrated circuit.

In this embodiment, the DC-DC converter utilizes the amplitude of input data which is input into the signal processing system to indicate the load of the DC-DC converter. In other words, if the amplitude of the input data for the signal processing system is higher, then the load on the DC-DC converter is higher.

In step 501, the DC-DC converter receives the input data, wherein the input data is for inputting into the signal processing system. For the example illustrated in FIG. 1, the input data may comprise the signal, SIG, and the signal processing system may comprise the speaker amplifier 108.

In step 502, the DC-DC converter determines an amplitude of the input data.

In step 503, the DC-DC converter transitions between DCM and CCM based on the amplitude of the input data. For example, responsive to determining that the amplitude of the input data is below a first threshold value, the DC-DC converter may transition from operating in CCM to operating in DCM. Furthermore, responsive to determining that the amplitude of the input data is above a second threshold value, the DC-DC converter may transition from operating in DCM to operating in CCM.

In some embodiments, the first threshold value and the second threshold value are the same. In some embodiments, the first threshold value and second threshold value are different in order to avoid ping-ponging between the different modes of operation. In other words, if only one threshold is used, the DC-DC converter may transition rapidly between operating states when the amplitude of the input data hovers around the threshold value.

In some embodiments, in order to prevent the ping-ponging between different modes of operation, a time-based hold may be applied to exiting CCM operation before entering DCM operation. This time hold is somewhat of a time-based hysteresis. However, exiting DCM operation may occur immediately following a threshold violation so that CCM may properly regulate the boost voltage $V_{BST}$. Under heavy or rapidly increasing loading conditions, DCM may not be able to properly regulate the boost voltage $V_{BST}$.

Figure 6:
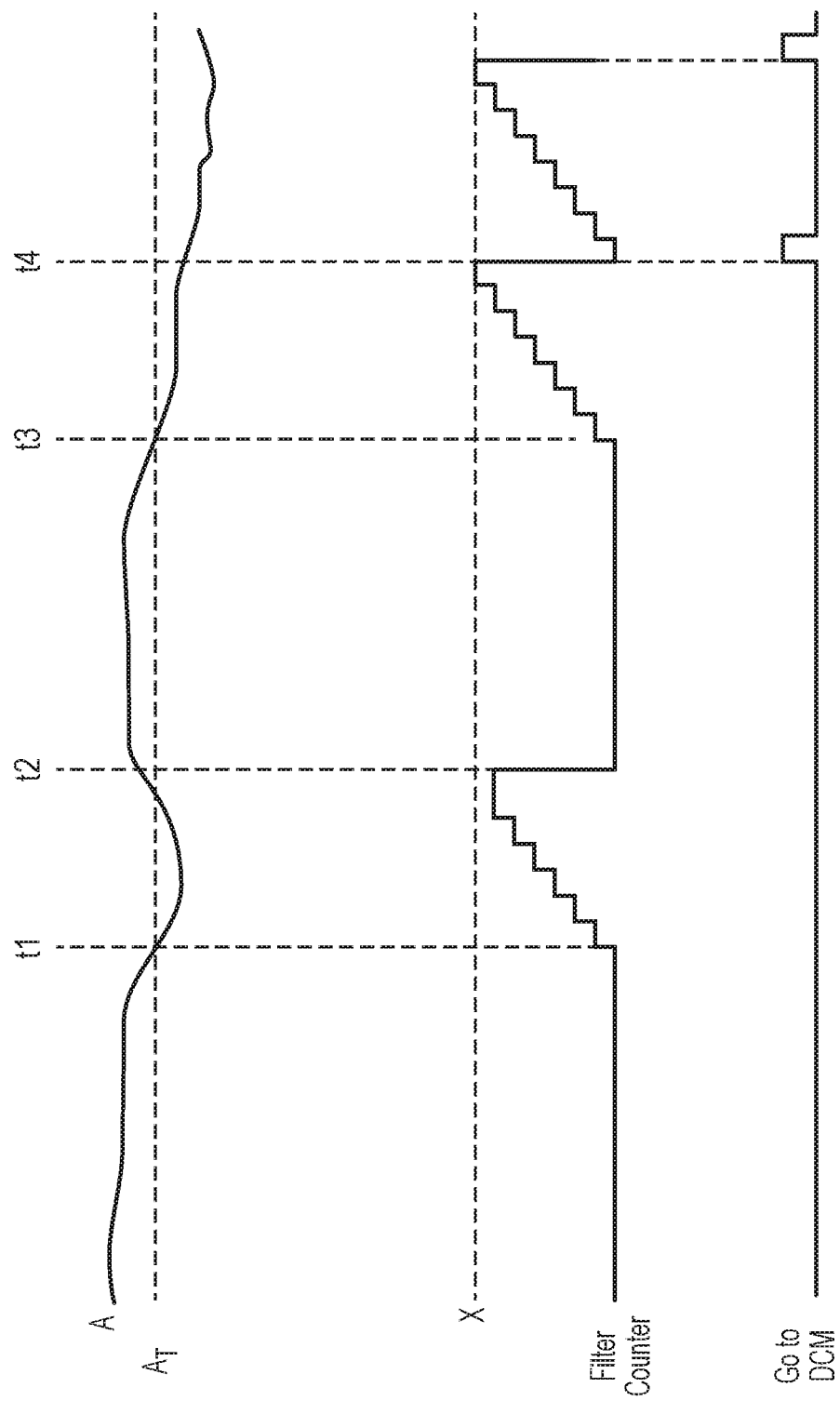
FIG. 6 is an example timing diagram illustrating an operation of a DC-DC converter configured to transition between DCM and CCM as described in FIG. 5.

FIG. 6 is an example timing diagram that illustrates an operation of a DC-DC converter configured to transition between DCM and CCM as described in FIG. 5.

In this embodiment, the value of the amplitude of the input data is compared to a threshold value $A_T$ to determine whether to operate in DCM or CCM. In particular, if the amplitude of the input data is above threshold value $A_T$, the DC-DC converter operates in CCM, and if the amplitude of the input data is below threshold value $A_T$, the DC-DC converter operates in DCM. In this example, only one threshold value is used, however, as described above in some embodiments, two threshold values may be used.

In this example, the DC-DC converter transitions from CCM to DCM responsive to the amplitude of the input data remaining below the first threshold value for a predetermined time. By waiting a predetermined time before transitioning between the modes of operation, the DC-DC converter avoids ping-ponging between the two modes of operation.

For example, the DC-DC converter may comprise a filter counter configured to count clock cycles from when the amplitude first passes below the threshold $A_T$, at time t1, until the amplitude passes back above the threshold $A_T$, at time t2. In this example, at the time t2, the filter counter has not yet counted to a predetermined number X of clock cycles. The DC-DC converter may therefore not transition into DCM. However, at time t3, the amplitude passes below the threshold $A_T$ again, and this time remains below the threshold long enough for the filter counter to count X clock cycles. Therefore, at time t4, when the filter counter counts X clock cycles, the DC-DC converter may transition into DCM.

Equivalently, the DC-DC converter may transition from DCM to CCM responsive to the amplitude of the input data remaining above the threshold value for a predetermined time.

As described previously with respect to FIGS. 3a and 4, the controller 222 may alter the operating state from CCM to DCM by including an extra switching state $S_3$ in which both switches 206 and 208 are in a non-conducting state.

Figure 7:
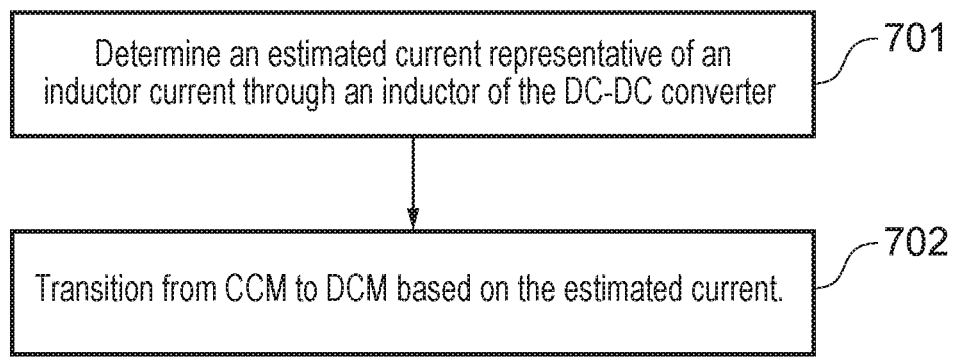
FIG. 7 is an example flow chart diagram illustrating a method in a DC-DC converter for transitioning from a continuous conduction mode CCM to a discontinuous conduction mode, DCM, in accordance with the present disclosure.

FIG. 7 is an example flow chart that illustrates a method in a DC-DC converter for transitioning from a continuous conduction mode CCM to a discontinuous conduction mode, DCM. In this embodiment, the DC-DC converter may power any signal processing system, for example an amplifier.

In step 701, the DC-DC converter determines an estimated current representative of an inductor current through an inductor of the DC-DC converter. Such an example DC-DC converter is illustrated in U.S. Pat. No. 9,912,238 hereby incorporated by reference.

For example, the DC-DC converter may determine the estimated current by measuring the current through the inductor, for example using a current mirror 218. The measured current may then be converted into digital samples.

For example, the current through the N-FET 206 may be measured. In other words, the current through the inductor may be measured during the switching state $S_1$ of the switching cycle as the current is ramped up. The current may be measured using, for example a multi-bit ADC or two comparators.

Based on the measurement of the current during the state $S_1$ period, the method may then comprise estimating an inductive value of the inductor based on the measured current. The current during the second time period for state $S_2$ may then be estimated based on the estimated inductance, the boost voltage $V_{BST}$, and the supply voltage value. In some examples, the estimated current comprises a peak inductor current. In some examples, the estimated current comprises an average inductor current. The average inductor current may be proportional to the load current. In some examples, the estimated current comprises an average peak inductor current. By taking an average of the peak inductor current, any transient peaks in the inductor current may be removed, resulting in a more accurate representation of the load current.

In step 702, the DC-DC converter transitions from CCM to DCM based on the estimated current. For example, the DC-DC converter may compare the estimated current to a threshold value $I_T$, and, responsive to the estimated current being below the threshold value $I_T$, the DC-DC converter may transition from CCM to DCM.

Figure 8:
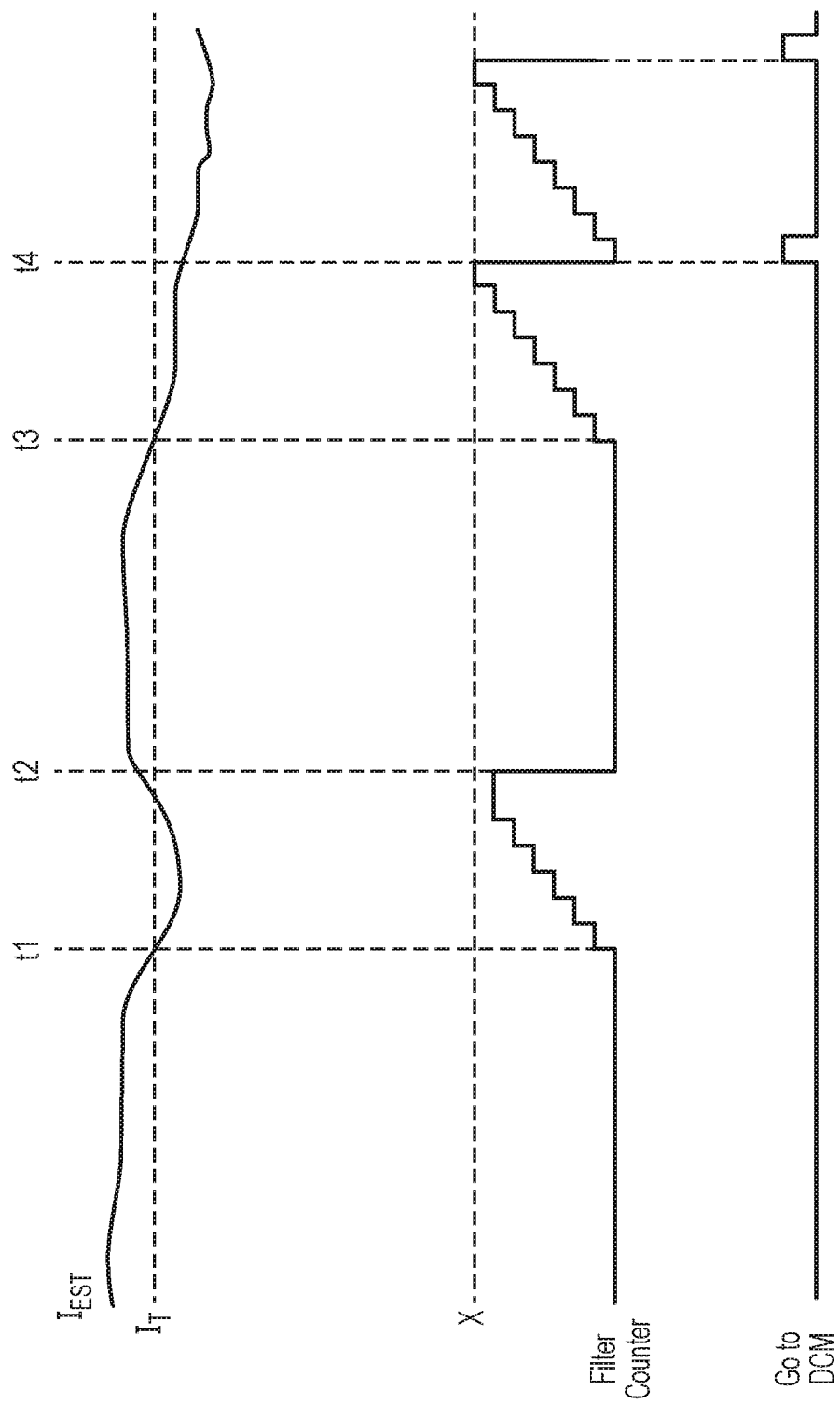
FIG. 8 is an example timing diagram illustrating an operation of a DC-DC converter configured to transition from CCM to DCM as described in FIG. 7.

FIG. 8 is an example timing diagram that illustrates an operation of a DC-DC converter configured to transition from CCM to DCM as described in FIG. 7.

In this embodiment, the estimated current $I_{EST}$ representative of the current through the inductor is compared to a threshold value $I_T$ to determine whether to transition from CCM to DCM. In particular, when operating in CCM, the estimated current passes below the threshold $I_T$, the DC-DC converter may transition to operating in DCM.

In this example, a filter counter starts to count clock cycles from when the estimated current first passes below the threshold $I_T$ at time t1. At time t2, the estimated current passes back above the threshold value $I_T$. However, at this time, the filter counter has not yet counted a predetermined number X of clock cycles. The DC-DC converter does not therefore transition into DCM. However, at time t3, the estimated current passes below the threshold $I_T$ again, and this time remains below the threshold long enough for the filter counter to count X clock cycles. Therefore, at time t4, when the filter counter counts X clock cycles, the DC-DC converter transitions into DCM.

The DC-DC converter therefore transitions from CCM to DCM responsive to the estimated current remaining below the threshold value $I_T$ for a predetermined time.

It will be appreciated, that due to the inductor current being maintained or pinned to zero when operating in DCM, the inductor current may not be used, in some circumstances, to transition from DCM to CCM.

In some examples, the DC-DC converter may transition from DCM to CCM as described with reference to FIGS. 5 and 6, or with reference to FIGS. 9 and 10.

Figure 9:
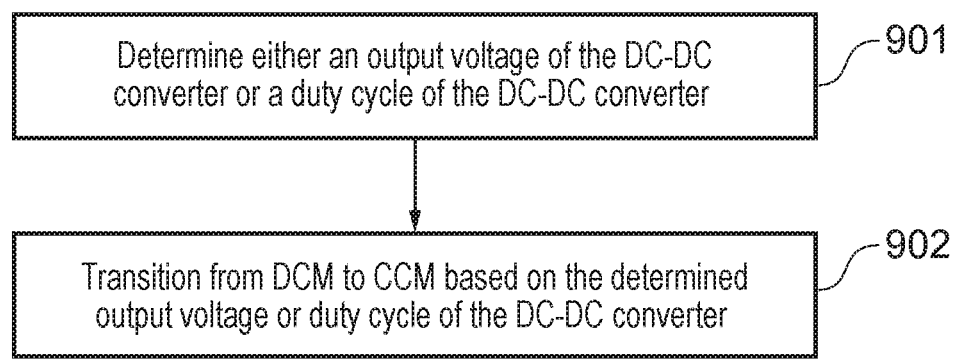
FIG. 9 is an example flow chart diagram illustrating a method in a DC-DC converter for transitioning from a discontinuous conduction mode, DCM, to a continuous conduction mode, CCM, in accordance with the present disclosure.

FIG. 9 is an example flow chart that illustrates a method in a DC-DC converter for transitioning from a discontinuous conduction mode, DCM, to a continuous conduction mode, CCM.

In step 901, the DC-DC converter determines either an output voltage of the DC-DC converter or a duty cycle of the DC-DC converter.

For example, as illustrated in FIG. 2, an ADC may be configured to receive the boost voltage $V_{BST}$ and to output a digital version of the boost voltage to the controller 222. Alternatively, the DC-DC converter may determine the duty cycle as the on time of the NFET switch 206. In particular, the duty cycle in DCM may be determined as the time period during which the inductor current is increased. The duty cycle may in some embodiments be monitored by comparing the NFET on signal with a reference on-signal generated by internal clocks using logic gates.

In step 902, the DC-DC converter transitions from DCM to CCM based on the determined output voltage or duty cycle of the DC-DC converter. For example, the controller 222 may control the switching states of the DC-DC converter based on the output voltage or duty cycle.

For example, the controller 222 may compare the output voltage of the DC-DC converter to a first threshold value, and responsive to the output voltage being below the first threshold value may cause the DC-DC converter to transition from DCM to CCM. In other words, as the output voltage of the DC-DC converter is low, this low value may indicate that the inductor 204 is not being charged enough to keep the boost voltage within a desired range. The controller may therefore switch the DC-DC converter to CCM in order to allow the boost voltage to be increased.

In some embodiments, the controller 222 compares the duty cycle of the DC-DC converter to a second threshold value, and responsive to the duty cycle being above the second threshold value, the DC-DC converter transitions from DCM to CCM. In other words, when the load increases, the time taken to reach a maximum current during state $S_1$ increases, and therefore the duty cycle increases. Contrary to CCM, during DCM it is known that the current through the inductor starts at zero at the start of the state $S_1$ period, and therefore the duty cycle may be used as an indication of the load during DCM.

Figure 10:
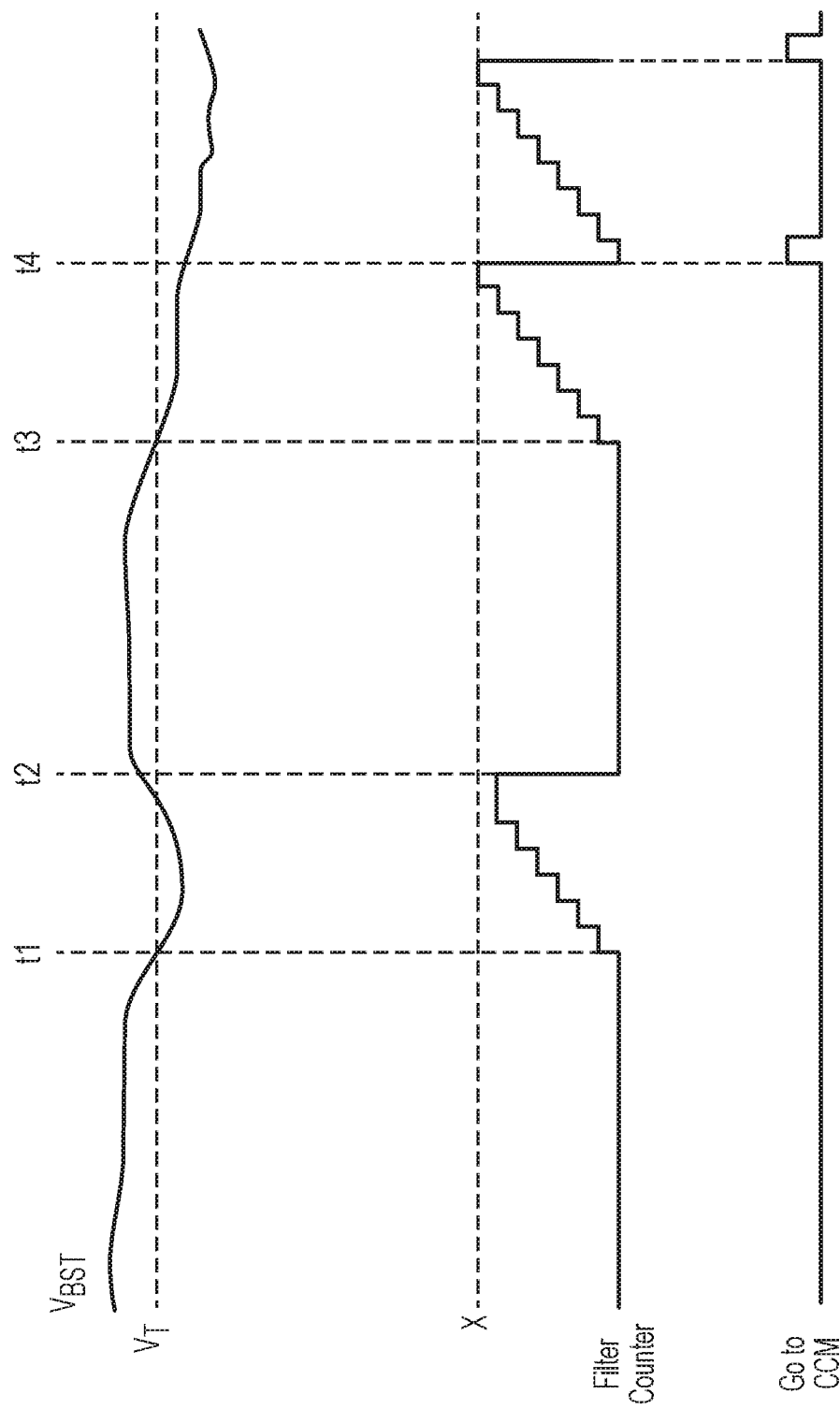
FIG. 10 is an example timing diagram illustrating an operation of a DC-DC converter configured to transition from CCM to DCM as described in FIG. 9.

FIG. 10 is an example timing diagram that illustrates an operation of a DC-DC converter configured to transition from CCM to DCM as described in FIG. 9.

As illustrated in FIG. 10, the DC-DC converter may transition from DCM to CCM responsive to the output voltage being below the first threshold value for a predetermined time. This manner of transition avoids ping-ponging between the two modes of operation.

In the example illustrated in FIG. 10, the output voltage of the DC-DC converter is compared to a threshold value $V_T$ to determine whether to transition from DCM to CCM. In particular, when operating in DCM, the output voltage passes below the threshold $V_T$, the DC-DC converter may transition to operating in CCM.

In this example, the DC-DC converter comprises a filter counter configured to count clock cycles from when the output voltage first passes below the threshold $V_T$ at time t1 to when the output voltage passes back above the threshold $V_T$ at time t2. In this example, the filter counter has not yet counted a predetermined number X of clock cycles at time t2. The DC-DC converter may therefore not transition into CCM. However, at time t3, the output voltage passes below the threshold $V_T$ again, and this time remains below the threshold long enough for the filter counter to count X clock cycles. Therefore, at time t4, when the filter counter has counted X clock cycles, the DC-DC converter may transition into CCM.

Figure 11:
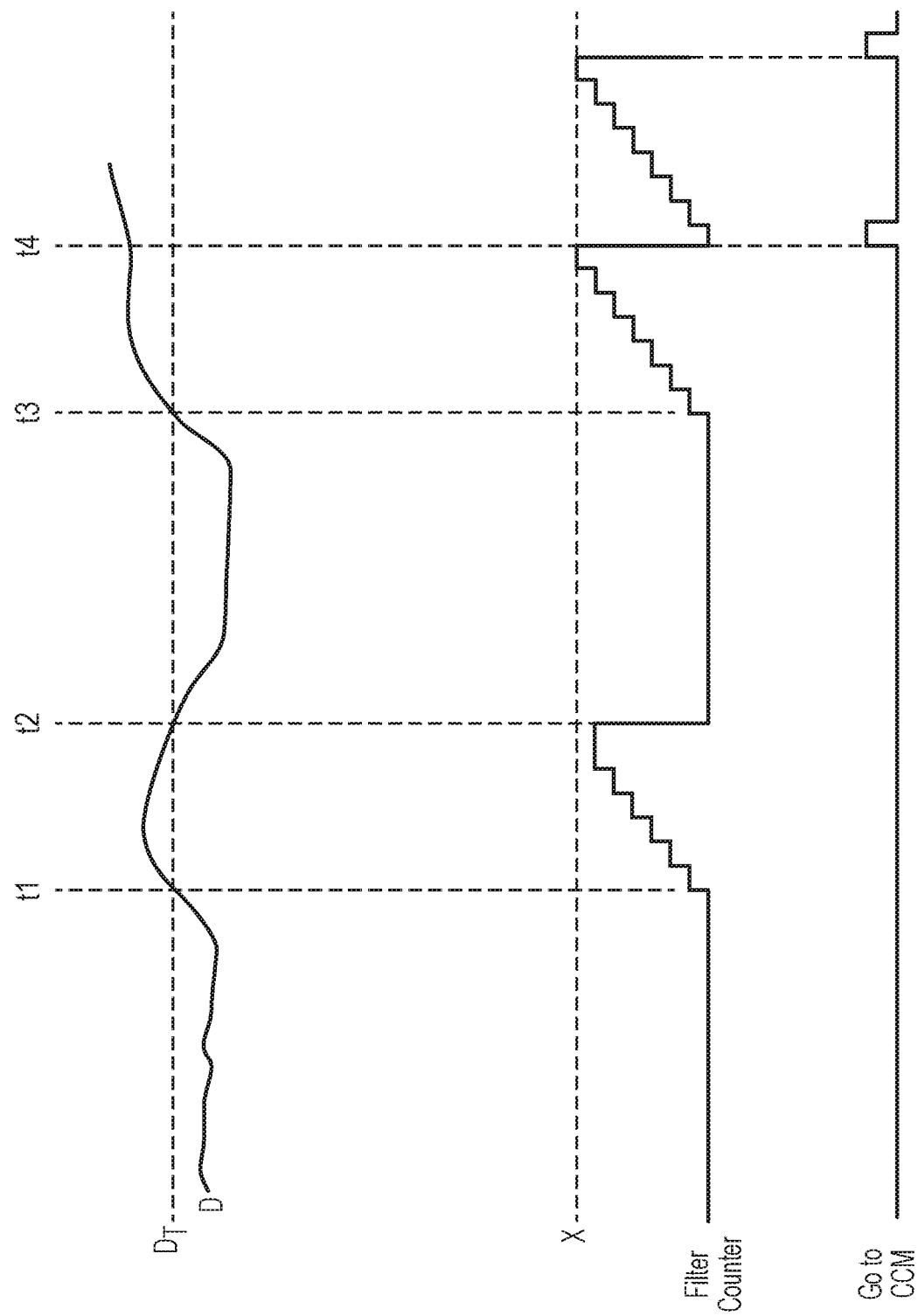
FIG. 11 is an example timing diagram illustrating an operation of a DC-DC converter configured to transition from CCM to DCM as described in FIG. 9.

Equivalently, as illustrated in FIG. 11 the DC-DC converter may transition from DCM to CCM responsive to the duty cycle remaining above the second threshold value for a predetermined time. Again, this avoids ping-ponging between the two modes of operation.

In the example illustrated in FIG. 11, the duty cycle of the DC-DC converter is compared to a threshold value $D_T$ to determine whether to transition from DCM to CCM. In particular, when operating in DCM, the duty cycle passes above the threshold $D_T$, the DC-DC converter may transition to operating in CCM.

In this example, the DC-DC converter comprises a filter counter configured to count clock cycles from when the duty cycle first passes above the threshold $D_T$ at time t1 to when the duty cycle passes back below the threshold $D_T$ at time t2. In this example, the filter counter has not yet counted a predetermined number X of clock cycles at time t2. The DC-DC converter may therefore not transition into CCM. However, at time t3, the duty cycle passes above the threshold $D_T$ again, and this time remains above the threshold long enough for the filter counter to count X clock cycles. Therefore, at time t4, when the filter counter has counted X clock cycles, the DC-DC converter may transition into CCM.

Figure 12:
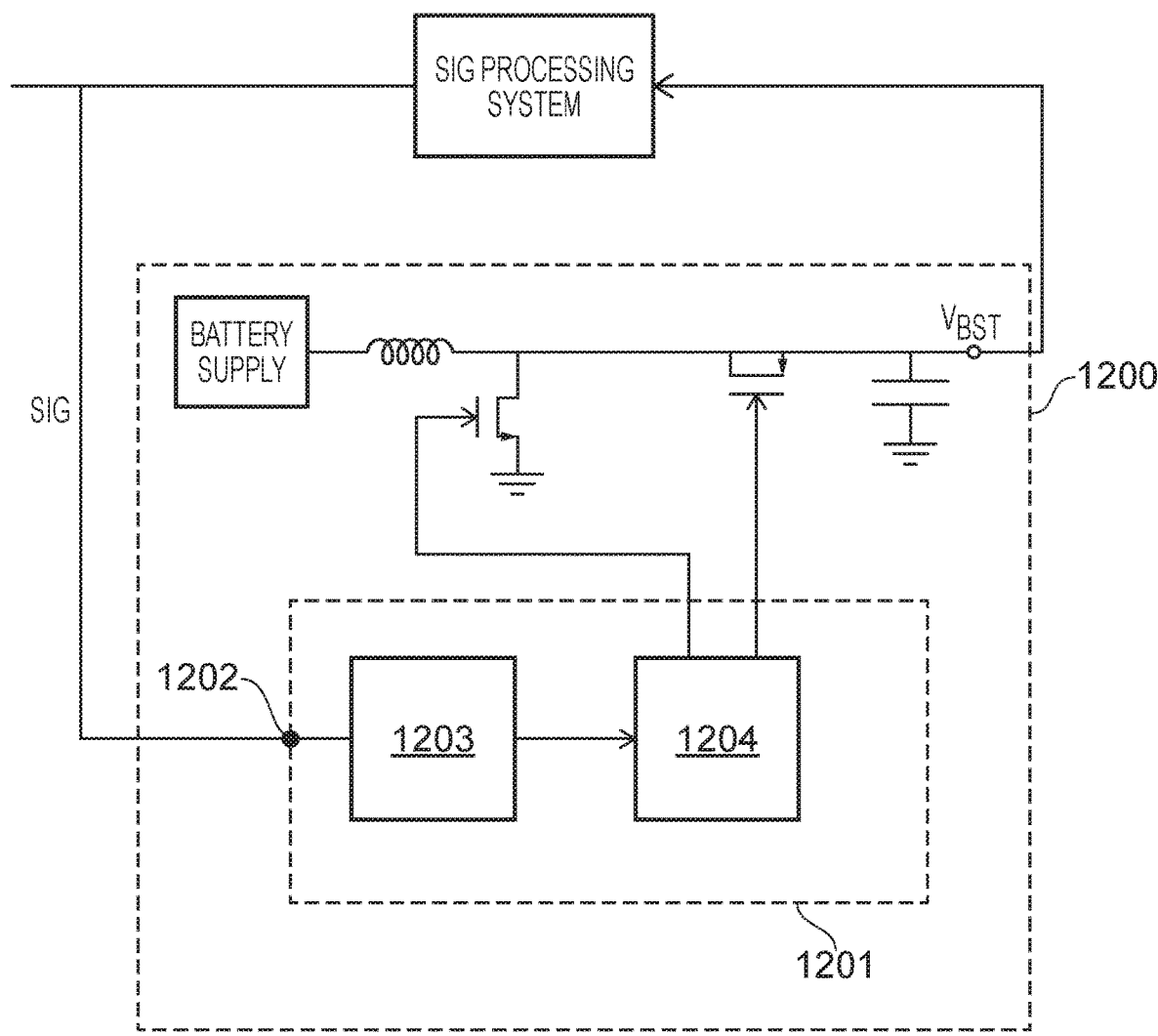
FIG. 12 is an example block diagram illustrating a DC-DC converter in accordance with embodiments of the present disclosure.

FIG. 12 illustrates a DC-DC converter 1200 according to some embodiments. The DC-DC converter 1200 is configured to transition between a discontinuous conduction mode, DCM, and a continuous conduction mode, CCM. In particular, the DC-DC converter 1200 is configured to power a signal processing system within an integrated circuit. The DC-DC converter 1200 comprises a controller 1201. The controller 1201 may be equivalent to the controller 222 illustrated in FIG. 2. The controller 1201 comprises an input 1202 configured to receive input data for input into the signal processing system. The DC-DC converter 1200 further comprises a determination block 1203 configured to determine an amplitude of the input data. The DC-DC converter further comprises a transitioning block 1204 configured to cause the DC-DC converter to transition between the DCM and the CCM based on the amplitude of the input data.

For example, the transitioning block may comprise a level shifting and driving block configured to alter the switching states of the DC-DC converter.

The DC-DC 1200 converter may comprise an NFET, a PFET switch, an inductor and a capacitor connected as described with reference to FIG. 2. However, it will be appreciated that other implementations of boost converters may also be used.

Figure 13:
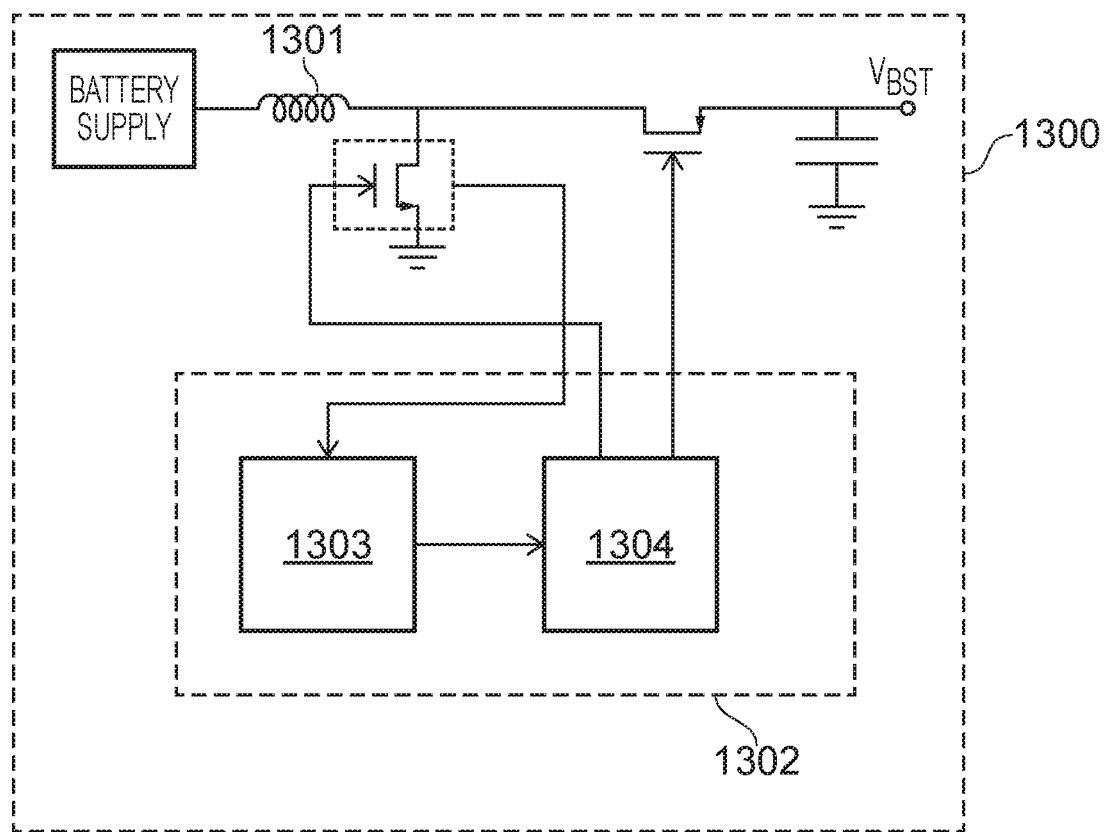
FIG. 13 is another example block diagram illustrating a DC-DC converter in accordance with embodiments of the present disclosure.

FIG. 13 illustrates a DC-DC converter 1300 according to some embodiments.

The DC-DC converter 1300 comprises an inductor 1301 and a controller 1302. The controller comprises a current estimation block 1303 configured to determine an estimated current representative of an inductor current through the inductor 1301. In some embodiments, the current estimation block may comprise a current mirror and an ADC. The controller further comprises a transitioning block 1304 configured to cause the DC-DC converter to transition from CCM to DCM based on the estimated current. For example, the transitioning block may comprise a level shifting and driving block configured to alter the switching states of the DC-DC converter.

The DC-DC 1300 converter may comprise an NFET, a PFET switch and a capacitor connected as described with reference to FIG. 2. However, it will be appreciated that other implementations of boost converters may also be used.

Figure 14:
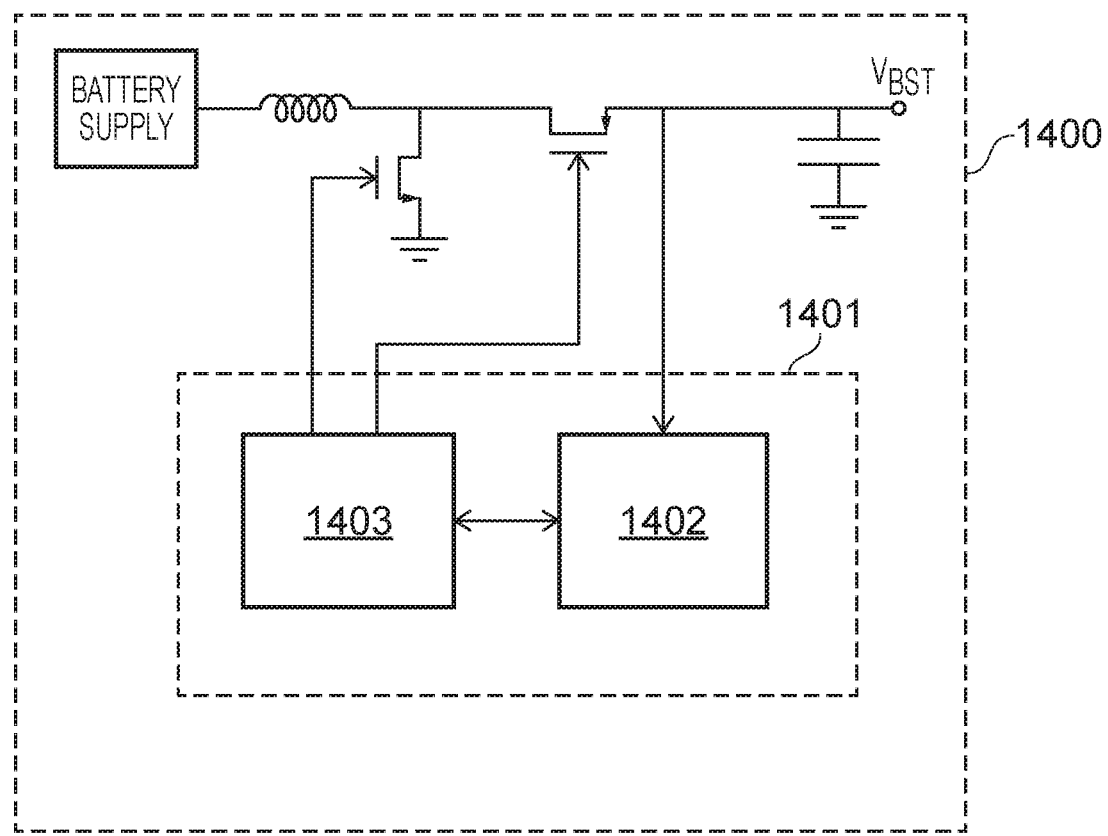
FIG. 14 is a further example block diagram illustrating a DC-DC converter in accordance with embodiments of the present disclosure.

FIG. 14 illustrates a DC-DC converter according to some embodiments.

The DC-DC converter 1400 may be configured to transition from a discontinuous conduction mode, DCM, to a continuous conduction mode, CCM. The DC-DC converter comprises a controller 1401 comprising a determination block 1402 configured to determine either an output voltage of the DC-DC converter or a duty cycle of the DC-DC converter.

For example, the determination block may comprise an ADC configured to receive the output voltage of the DC-DC converter, $V_{BST}$, and to output a digital version of the output voltage. The controller may comprise a transitioning block 1403 configured to cause the DC-DC converter to transition from DCM to CCM based on the determined output voltage of the DC-DC converter.

In some examples, the transitioning block 1403 may be configured to control the switching states of the switches 1404 and 1405 in the DC-DC converter. When operating the DCM, the duty cycle of the DC-DC converter may be determined as the state $S_1$ period as described with respect to FIG. 4.

In some embodiments, the determination block may receive an indication of the duty cycle from the transitioning block and may cause the transitioning block to transition from DCM to CCM based on the determined duty cycle.

There is therefore provided methods and apparatus for transitioning a DC-DC converter between a continuous conduction mode when high loads are present, and a discontinuous conduction mode when low modes are present. The transition between the two modes at an appropriate time dependent on the load allows the DC-DC converter to save power.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfill the functions of several units recited in the claims. Any reference numerals or labels in the claims shall not be construed so as to limit their scope. Terms such as amplify or gain include possible applying a scaling factor or less than unity to a signal.

The invention claimed is:

1. A method in a DC-DC converter for transitioning from a continuous conduction mode CCM to a discontinuous conduction mode, DCM, the method comprising:
   determining an estimated current representative of an inductor current through an inductor of the DC-DC converter during both a first time period in which energy is stored in the inductor and a second time period in which energy is transferred from the inductor by measuring a current though a switch of the DC-DC converter, wherein the switch is conducting during the first time period and non-conducting during the second time period; and
   transitioning the DC-DC converter operating in the CCM from the CCM to the DCM based on the estimated current.

2. The method of claim 1 further comprising determining the estimated current by:
   measuring the current through the inductor; and
   converting the measured current to digital samples.

3. The method of claim 1 further wherein determining the estimated current comprises measuring a peak inductor current.

4. The method of claim 1 wherein determining the estimated current comprises measuring an average peak inductor current.

5. The method of claim 1 wherein determining the estimated current comprises measuring an average inductor current.

6. The method of claim 1 further comprising comparing the estimated current to a threshold value, and
   responsive to the estimated current being below the threshold value, transitioning the DC-DC converter from the CCM to the DCM.

7. The method of claim 6 further comprising, transitioning the DC-DC converter from the CCM to the DCM responsive to the estimated current remaining below the threshold value for a predetermined time.

8. The method of claim 1 further comprising:
   determining either an output voltage of the DC-DC converter or a duty cycle of the DC-DC converter; and
   transitioning the DC-DC converter from the DCM to the CCM based on the determined output voltage or duty cycle of the DC-DC converter.

9. A DC-DC converter configured to transition from a continuous conduction mode, CCM, to a discontinuous conduction mode, DCM, the DC-DC converter comprising:
   an inductor; and
   a controller comprising:
      a current estimation block configured to determine an estimated current representative of an inductor current through the inductor during both a first time period in which energy is stored in the inductor and a second time period in which energy is transferred from the inductor by measuring a current though a switch of the DC-DC converter, wherein the switch is conducting during the first time period and non-conducting during the second time period; and
      a transitioning block configured to cause the DC-DC converter to transition from the CCM to the DCM based on the estimated current.

10. The DC-DC converter of claim 9 wherein the current estimation block comprises:
    a current mirror configured to measure the current through the inductor; and
    an analog to digital converter (ADC) configured to receive the measured current and output samples of the measured current.

11. The DC-DC converter of claim 9 wherein the estimated current is determined by measuring the peak inductor current.

12. The DC-DC converter of claim 9 wherein the estimated current is determined by measuring the average measured peak inductor current.

13. The DC-DC converter of claim 9 wherein the estimated current is determined by measuring an average inductor current.

14. The DC-DC converter as claimed in claim 9 further comprising:
    a determination block configured to determine either an output voltage of the DC-DC converter or a duty cycle of the DC-DC converter; wherein the transitioning block is further configured to cause the DC-DC converter to transition from the DCM to the CCM based on the determined output voltage or duty cycle of the DC-DC converter.

15. The DC-DC converter of claim 9 wherein the transitioning block is configured to cause the DC-DC converter to transition from the CCM to the DCM responsive to the estimated current being below a threshold value.

16. The DC-DC converter of claim 15 wherein the transitioning block is configured to cause the DC-DC converter to transition from the CCM to the DCM responsive to the estimated current remaining below the threshold value for a predetermined time.

* * * * *

UNITED STATES PATENT AND TRADEMARK OFFICE
CERTIFICATE OF CORRECTION

PATENT NO. : 10,644,593 B2
APPLICATION NO. : 16/227819
DATED : May 5, 2020
INVENTOR(S) : Pazhayaveetil et al.

It is certified that error appears in the above-identified patent and that said Letters Patent is hereby corrected as shown below:

In the Claims

1. In Column 11, Line 22, in Claim 1, delete "mode CCM" and insert -- mode, CCM, --, therefor.

2. In Column 11, Line 30, in Claim 1, delete "though" and insert -- through --, therefor.

3. In Column 12, Line 16, in Claim 9, delete "though" and insert -- through --, therefor.

Signed and Sealed this
Thirty-first Day of October, 2023

Katherine Kelly Vidal
*Director of the United States Patent and Trademark Office*